(12) United States Patent
Karino

(10) Patent No.: US 9,048,278 B2
(45) Date of Patent: Jun. 2, 2015

(54) SEMICONDUCTOR DEVICE

(75) Inventor: Taichi Karino, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 57 days.

(21) Appl. No.: 13/991,956

(22) PCT Filed: Dec. 1, 2011

(86) PCT No.: PCT/JP2011/077866
§ 371 (c)(1),
(2), (4) Date: Aug. 21, 2013

(87) PCT Pub. No.: WO2012/077581
PCT Pub. Date: Jun. 14, 2012

(65) Prior Publication Data
US 2013/0320499 A1    Dec. 5, 2013

(30) Foreign Application Priority Data

Dec. 6, 2010    (JP) ................. 2010-271781

(51) Int. Cl.
| | |
|---|---|
| *H01L 29/66* | (2006.01) |
| *H01L 29/73* | (2006.01) |
| *H01L 27/02* | (2006.01) |
| *H01L 23/00* | (2006.01) |

(52) U.S. Cl.
CPC ........ *H01L 29/7302* (2013.01); *H01L 27/0259* (2013.01); *H01L 24/05* (2013.01); *H01L 2224/4847* (2013.01); *H01L 2924/13091* (2013.01); *H01L 2224/48458* (2013.01); *H01L 2924/1305* (2013.01)

(58) Field of Classification Search
None
See application file for complete search history.

(56) References Cited

U.S. PATENT DOCUMENTS

| | | | | |
|---|---|---|---|---|
| 4,262,295 A | * | 4/1981 | Okano et al. | 257/589 |
| 4,862,238 A | * | 8/1989 | Shannon | 257/29 |
| 5,138,413 A | | 8/1992 | Grosset et al. | |
| 6,313,537 B1 | | 11/2001 | Lee et al. | |
| 6,323,539 B1 | * | 11/2001 | Fujihira et al. | 257/630 |

FOREIGN PATENT DOCUMENTS

| | | |
|---|---|---|
| JP | 02-170562 B2 | 7/1990 |
| JP | 5-503400 A | 6/1993 |
| JP | 10-261765 A | 9/1998 |
| JP | 11-186320 A | 7/1999 |

(Continued)

OTHER PUBLICATIONS

Japanese Office Action for corresponding JP 2012-547816, mail date Jun. 10, 2014. Partial English translation provided.

(Continued)

*Primary Examiner* — Yasser A Abdelaziez
(74) *Attorney, Agent, or Firm* — Rossi, Kimms & McDowell LLP

(57) ABSTRACT

By configuring an ESD protection element of an NPN transistor (101), it is possible to reduce the area of the ESD protection element and reduce the voltage in a region in which the current increases sharply, and thus possible to increase ESD tolerance. Also, it is possible to provide a highly reliable semiconductor device wherein it is possible to flatten and smooth the surface of an upper layer pad electrode (16) by dividing a pad electrode (8) into a two-layer structure sandwiching an interlayer insulating film (15), and possible to increase the junction strength of a bonding wire, and suppress damage to underlying silicon layers when bonding.

11 Claims, 12 Drawing Sheets

(56) References Cited

FOREIGN PATENT DOCUMENTS

| | | |
|---|---|---|
| JP | 2000-174217 A | 6/2000 |
| JP | 2000-269439 A | 9/2000 |
| JP | 2005-223026 A | 8/2005 |
| JP | 2006-196487 A | 7/2006 |
| JP | 2006-294776 A | 10/2006 |
| JP | 2009-021622 A | 1/2009 |
| JP | 2010-050177 A | 3/2010 |

OTHER PUBLICATIONS

International Search Report for PCT/JP2011/077866. Mail date Feb. 28, 2012.

* cited by examiner

SEMICONDUCTOR DEVICE

This application is a U.S. National Phase Application of PCT International Application PCT/JP2011/077866 filed on Dec. 1, 2011, which is based on and claims priority from JP 2010-271781 filed on Dec. 6, 2010, the contents of which is incorporated in its entirety by reference.

TECHNICAL FIELD

The present invention relates to a semiconductor device having an ESD protection element.

BACKGROUND ART

To date, it is common in a semiconductor device such as a power IC that an ESD protection element connected to an input terminal and protecting the semiconductor device from surge voltage is disposed adjacent to a wire bonded pad electrode.

Also, to date, a semiconductor device wherein an ESD protection element is disposed under a pad electrode in order to reduce the chip area has also been developed. Next, a description will be given of one example of a heretofore known semiconductor device wherein an ESD protection element is disposed under a pad electrode.

FIG. 7 is a main portion sectional view of a semiconductor device having a heretofore known ESD protection diode 501. A main portion section in the vicinity of the ESD protection diode 501 is shown in FIG. 7. In FIG. 7, the ESD protection diode 501 of the semiconductor device 500 includes a p-type layer 52 disposed on a p-type semiconductor substrate 51, a LOCOS oxide film 53 disposed on the p-type layer 52, an n-type layer 54 disposed sandwiched by the LOCOS oxide film 53 on the p-type layer 52, and a p-type layer 55.

Also, the ESD protection diode 501 of the semiconductor device 500 includes a insulating film 56 disposed on the LOCOS oxide film 53 and n-type layer 54, contact holes 57 disposed in the insulating film 56 and LOCOS oxide film 53, and a pad electrode 58 disposed on the insulating film 56 on the n-type layer 54 and electrically connected via the contact holes 57 to the n-type layer 54. Also, the ESD protection diode 501 of the semiconductor device 500 includes a metal electrode 59 disposed distanced from the pad electrode 58 on the insulating film 56 and electrically connected to the p-type layer 55.

Also, the ESD protection diode 501 of the semiconductor device 500 includes a passivation film 60, opened above the pad electrode 58, disposed on the surfaces of the pad electrode 58 and metal electrode 59. The pad electrode 58 is the cathode electrode of the ESD protection diode 501, while the metal electrode 59 is the anode electrode. An unshown metal wire is connected to the anode electrode. A bonding wire 61 is fixed to the pad electrode 58. In FIG. 7, reference sign R indicates the operating resistance of the ESD protection diode 501, and for descriptive purposes is shown on the p-type semiconductor substrate 51.

FIG. 8 is a diagram showing the relationship between the voltage and current of the heretofore known ESD protection diode 501. In FIG. 8, the solid line indicates the relationship between the voltage and current of the ESD protection diode 501 when the area of the ESD protection diode 501 is in the region of, for example, 0.5 mm×0.5 mm. The dotted line indicates the relationship between the voltage and current of the ESD protection diode 501 when the area is in the region of, for example, 80 μm×80 μm. The current-voltage curve shown in FIG. 8 is such that the current starts at an avalanche voltage Vav of the ESD protection diode 501. The operating resistance is the reciprocal of the gradient (current÷voltage), and depends on the lateral resistance R when the p-type layer 52 and p-type semiconductor substrate 51 are combined (shown for descriptive purposes on the p-type semiconductor substrate 51 in FIG. 7).

The ESD protection diode 501 is such that, by increasing the gradient based on the current-voltage curve as indicated by the solid line in FIG. 8, it is possible to effectively clamp the surge voltage. By clamping the surge voltage, it is possible to protect an internal circuit (an element such as a MOSFET) of the semiconductor device 500 from the surge voltage.

Also, in PTL 1, there is a description of a semiconductor device wherein an ESD protection element formed of a lateral bipolar transistor is formed under a pad electrode. As the bipolar transistor has a lateral structure, the emitter electrode, base electrode, and collector electrode are formed in positions laterally distanced from one another, and the collector electrode is not of a structure that encloses the emitter electrode. Also, when the transistor operates, almost all the current flows laterally through a surface layer from the collector to the emitter.

Also, in PTL 2, it is described that a vertical bipolar transistor is used as an ESD protection element. Also, in PTL 3, a description is given of a diode wherein a insulating film is formed under a pad, stress when wire bonding is alleviated, and the leakage current is reduced.

Also, in PTL 4, a description is given of a semiconductor device wherein a protection diode is formed under a pad. Also, in PTL 5, it is described that a pad and protection element are integrated using an epitaxial substrate, and bonded metal wiring and wiring passing through a diode are connected to an internal circuit.

CITATION LIST

Patent Literature

PTL 1: JP-A-2010-50177
PTL 2: JP-A-2009-21622
PTL 3: JP-A-2006-294776
PTL 4: Japanese Patent No. 2,712,448
PTL 5: JP-A-2005-223026

SUMMARY OF INVENTION

Technical Problem

However, the semiconductor device 500 according to the heretofore described heretofore known technology is such that, when the area of the ESD protection diode 501 is reduced in order to reduce the chip area, the gradient based on the current-voltage curve decreases, as shown by the dotted line in FIG. 8. Because of this, the operating resistance of the ESD protection diode 501 increases, and a there is a problem in that it becomes difficult to protect the internal circuit of the semiconductor device 500 from the surge voltage.

Also, the semiconductor device 500 according to the heretofore described heretofore known technology is such that holes 65 generated by avalanche occurring in the p-n junction of the n-type layer 54 and p-type layer 52 of FIG. 7 reach the p-type layer 55 (the contact layer) via the lateral resistor R, wherein the p-type layer 52 and p-type semiconductor substrate 51 are combined, and flow into the metal electrode 59. As the holes 65 are the majority carriers in the p-type layer 52 and p-type semiconductor substrate 51, there is no decrease in the resistance value due to conductivity modulation. In this case, as the lateral resistance R is the resistance value obtained from a diffusion profile, which is a high value, the operating resistance of the ESD protection diode 501 is comparatively high. With the heretofore known technology, there is a problem in that the chip area increases owing to the area of the n-type layer 54 being increased in order to reduce the operating resistance.

Also, as the contact holes 57 are disposed in the insulating film 56 under the pad electrode 58, as shown in FIG. 7, the surface of the pad electrode 58 is of an uneven form, as in a place indicated by reference sign F in FIG. 7. In this way, there is a problem with the heretofore known technology in that the junction strength of the bonding wire decreases due to there being unevenness in the pad electrode 58. Also, the heretofore known technology is such that the silicon layers in a place indicated by reference sign G in FIG. 7 are liable to be damaged by stress when bonding or probing, and there is thus a problem in that reliability is reduced.

In PTL 1 to PTL 5, there is no description of measures for reducing the area of the ESD protection element and reducing the operating resistance, thereby increasing the ESD tolerance, for achieving a flattening and smoothing of the pad electrode by dividing the pad electrode into two layers, thereby increasing the junction strength of the bonding, or the like.

Also, the heretofore known technology described in PTL 1 is such that the current after the transistor operates flows through a surface layer, and furthermore, flows through a laterally long collector layer in which no conductivity modulation occurs, because of which there is a problem in that the operating resistance increases. Also, the heretofore known technology described in PTL 1 is such that, when the area of a contact layer connecting the collector electrode and collector layer is increased in order to reduce the operating resistance, it is necessary to provide a contact layer with a large area next to the base layer, and there is thus a problem in that the area of the ESD protection element increases.

The invention, in order to solve the problems with the heretofore described heretofore known technology, has an object of providing a semiconductor device such that it is possible to reduce the area of an ESD protection element, and also to reduce the operating resistance, thereby achieving an increase in ESD tolerance.

Also, the invention, in order to solve the problems with the heretofore described heretofore known technology, has an object of providing a highly reliable semiconductor device such that it is possible to flatten and smooth a pad electrode, increase the junction strength of a bonding wire, and furthermore, suppress damage to underlying silicon layers due to stress when bonding or probing.

Solution to Problem

In order to solve the heretofore described problems, and to achieve the objects, a semiconductor device according to the invention is characterized by including a first conductivity type first semiconductor layer, a second conductivity type second semiconductor layer disposed on the first semiconductor layer, a first conductivity type third semiconductor layer selectively disposed on the second semiconductor layer, a second conductivity type fourth semiconductor layer selectively disposed on the third semiconductor layer, a insulating film disposed on the fourth semiconductor layer, a pad electrode disposed on the insulating film and electrically connected via a plurality of contact holes formed in the insulating film to the fourth semiconductor layer, and a metal electrode electrically connected to the first semiconductor layer, second semiconductor layer, and third semiconductor layer, wherein the width of the second semiconductor layer sandwiched between the second semiconductor layer and fourth semiconductor layer is greater than the width of a depletion layer spreading toward the first semiconductor layer in the third semiconductor layer at the avalanche voltage of a diode formed of the fourth semiconductor layer and third semiconductor layer, and a transistor formed of the fourth semiconductor layer, third semiconductor layer, and second semiconductor layer becomes conductive at a voltage higher than the avalanche voltage of the diode.

Also, a semiconductor device according to the invention is characterized by including a first conductivity type first semiconductor layer, a second conductivity type second semiconductor layer disposed on the first semiconductor layer, a first conductivity type third semiconductor layer selectively disposed on the second semiconductor layer, a second conductivity type fourth semiconductor layer selectively disposed on the third semiconductor layer, a insulating film disposed on the fourth semiconductor layer, a pad electrode disposed on the insulating film and electrically connected via a plurality of contact holes formed in the insulating film to the fourth semiconductor layer, and a metal electrode electrically connected to the first semiconductor layer and third semiconductor layer, wherein a transistor formed of the fourth semiconductor layer, third semiconductor layer, and second semiconductor layer becomes conductive by carriers generated by avalanche in a diode formed of the fourth semiconductor layer and third semiconductor layer accumulating in the third semiconductor layer.

Also, the heretofore described semiconductor device according to the invention is characterized in that the plurality of contact holes are disposed so as to enclose the periphery of the pad electrode.

Also, the heretofore described semiconductor device according to the invention is characterized by including an interlayer insulating film disposed on the pad electrode, a plurality of upper layer contact holes disposed in the interlayer insulating film above an outer peripheral portion of the pad electrode, and an upper layer pad electrode disposed on the interlayer insulating film and electrically connected via the upper layer contact holes.

Also, the heretofore described semiconductor device according to the invention is characterized in that the insulating film and interlayer insulating film are BPSG films or HTO films.

Advantageous Effects of Invention

According to the semiconductor device according to the invention, an advantage is achieved in that it is possible to provide a semiconductor device wherein, by configuring the ESD protection element of a transistor, it is possible to reduce the area of the ESD protection element, possible to reduce the increase of voltage in a region in which the current increases sharply (the inclination of the current-voltage curve also becomes a steep gradient), and thus possible to increase the ESD tolerance.

Also, according to the semiconductor device according to the invention, an advantage is achieved in that it is possible to provide a highly reliable semiconductor device wherein it is possible to flatten and smooth the surface of an upper layer pad electrode by dividing the pad electrode into a two-layer structure sandwiching an interlayer insulating film, and possible to increase the junction strength of a bonding wire, and suppress damage to underlying silicon layers when bonding or probing.

BRIEF DESCRIPTION OF DRAWINGS

FIG. 1 is configuration diagrams of a semiconductor device of Embodiment 1 according to the invention, wherein FIG. 1(a) is a main portion plan view, and FIG. 1(b) is a main portion sectional view cut along an X-X line of FIG. 1(a).

FIG. 2(a) and FIG. 2(b) are diagrams illustrating an operation of an ESD protection transistor 101 of FIG. 1, wherein FIG. 2(a) is an enlarged sectional view of an A portion of FIG. 1(b), and FIG. 2(b) is an equivalent circuit diagram.

FIG. 4(a) and FIG. 4(b) are configuration diagrams of a semiconductor device of Embodiment 2 according to the invention, wherein FIG. 4(a) is a main portion plan view, and FIG. 4(b) is a main portion sectional view cut along an X-X line of FIG. 4(a).

FIG. 5(a) and FIG. 5(b) are configuration diagrams of a semiconductor device of Embodiment 3 according to the invention, wherein FIG. 5(a) is a main portion plan view, and FIG. 5(b) is a main portion sectional view cut along an X-X line of FIG. 5(a).

DESCRIPTION OF EMBODIMENTS

Hereafter, referring to the attached drawings, a detailed description will be given of preferred embodiments of a semiconductor device according to the invention.

Embodiment 1

Firstly, a description will be given of a configuration of a semiconductor device of Embodiment 1 according to the invention. FIG. 1(a) and FIG. 1(b) are configuration diagrams of the semiconductor device of Embodiment 1 according to the invention, wherein FIG. 1(a) is a main portion plan view, and FIG. 1(b) is a main portion sectional view cut along an X-X line of FIG. 1(a). Herein, the description will be given taking a first conductivity type to be a p-type and a second conductivity type to be an n-type. The semiconductor device according to the invention not being limited to the first conductivity type being a p-type and the second conductivity type an n-type, a reverse configuration (wherein the first conductivity type is an n-type and the second conductivity type a p-type) may be adopted.

Figure 1:
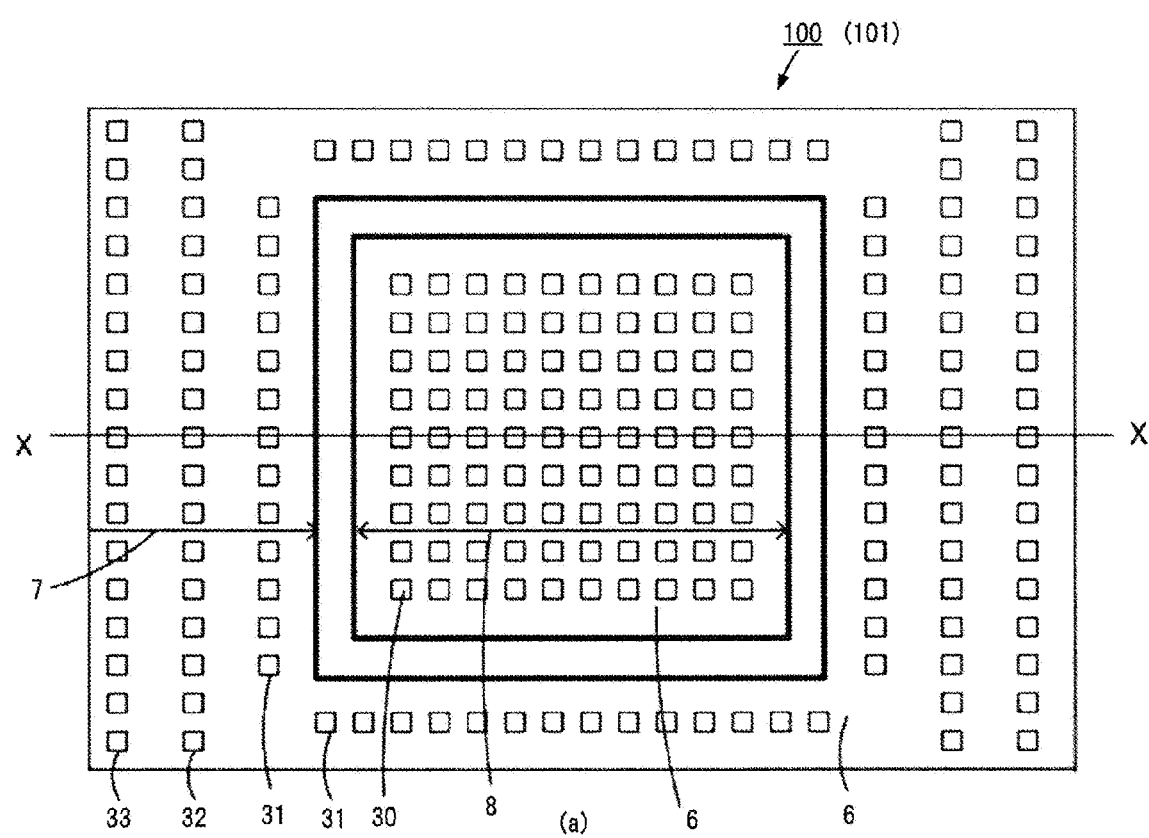
Figure 1:
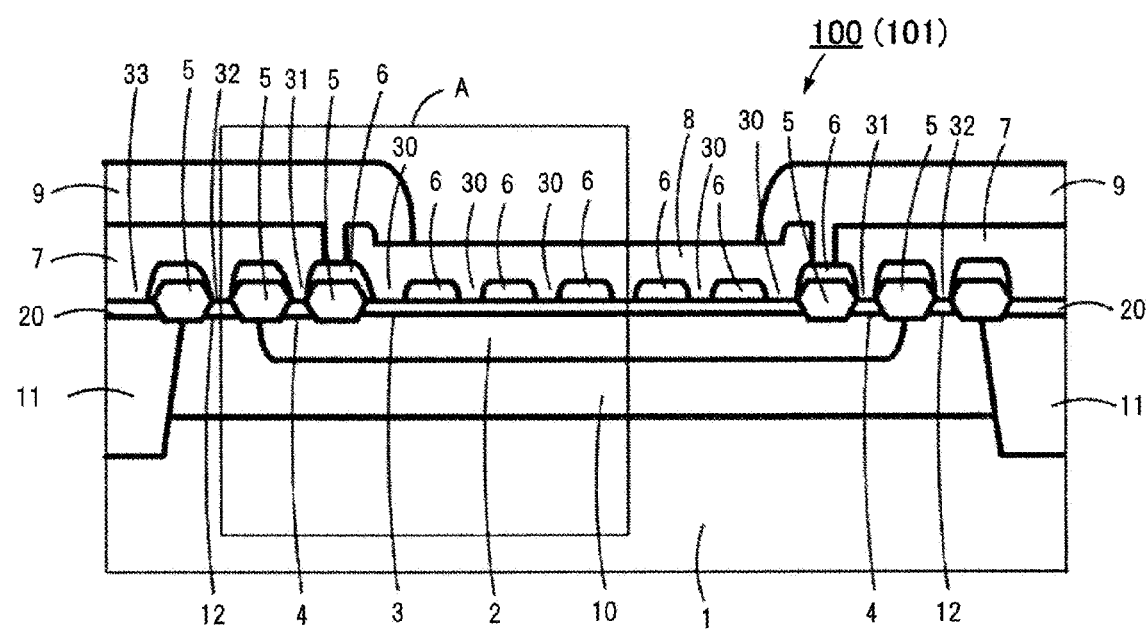

In FIG. 1, the semiconductor device 100 of Embodiment according to the invention has an ESD protection NPN transistor 101. FIG. 1 shows places in the ESD protection NPN transistor 101. The ESD protection NPN transistor 101 of the semiconductor device 100 includes an n-type layer 10 disposed on a p-type semiconductor substrate 1, a p-type layer 11, enclosing the n-type layer 10 and disposed so as to reach the p-type semiconductor substrate 1, and an n-type layer 12 disposed on the n-type layer 10 in a portion of the n-type layer 10 between the p-type layer 11 and a p-type layer 2.

Also, the ESD protection NPN transistor 101 includes the p-type layer 2 selectively disposed on the n-type layer 10, and a p-type layer 4 disposed enclosed by the p-type layer 2 on the p-type layer 2. Also, the ESD protection NPN transistor 101 includes an n-type layer 3 disposed enclosed by the p-type layer 4 when the ESD protection NPN transistor 101 is seen in plan view, and a LOCOS oxide film 5 disposed enclosing the n-type layer 3 in contact with each of the n-type layer 3 and p-type layer 11 between the n-type layer 3 and p-type layer 11.

Also, the ESD protection NPN transistor 101 includes a insulating film 6 disposed on the LOCOS oxide film 5 and on the n-type layer 3, and a pad electrode 8 disposed on the insulating film 6. The pad electrode 8 is in contact with the n-type layer 3 via a plurality of contact holes 30 disposed in the insulating film 6 and LOCOS oxide film 5.

Also, the ESD protection NPN transistor 101 includes a metal electrode 7 and a passivation film 9. The metal electrode 7 is disposed distanced from the pad electrode 8 on the insulating film 6 on the LOCOS oxide film 5 disposed between the p-type layer 11 and n-type layer 3. The passivation film 9 is disposed on the surface, opened above the pad electrode 8.

The metal electrode 7 is connected to the p-type layer 2 via contact holes 31, connected to the n-type layer 10 via contact holes 32, and connected to the p-type layer 11 via contact holes 33. The p-type layer 4, the n-type layer 12, and a p-type layer 20 are high concentration contact layers for reducing the contact resistance between the metal electrode 7 and the p-type layer 2, n-type layer 10, and p-type layer 11 respectively.

The heretofore described configuration is such that the n-type layer 3, which forms a collector, is enclosed by the p-type layer 2, which forms a base, and the p-type layer 2 is enclosed by the n-type layer 10, which forms an emitter. The n-type layer 3, which is the collector, is connected to the pad electrode 8 by the plurality of contact holes 30.

As the n-type layer 3, which is the collector, is enclosed by the p-type layer 2 and n-type layer 10 in this way, it is possible to increase the area of the collector in comparison with when disposing the collector beside the base, as in PTL 1, when the area of the ESD protection NPN transistor is the same. As a result of this, it is possible to reduce the operating resistance of the ESD protection NPN transistor in comparison with that in PTL 1, without increasing the collector area.

Also, the ESD protection NPN transistor of the invention is of a quasi-vertical structure, and furthermore, the n-type layer 3, which is a collector in which no conductivity modulation occurs, has a small thickness. As opposed to this, the configuration of FIG. 6 of PTL 1 is such that there is a wide space between a region 420, which is a collector between a region 9, which is a base, and 12a, which forms a collector electrode, and a region 11, because of which it is possible to reduce the operating resistance of the ESD protection NPN transistor of the invention in comparison with that in PTL 1.

Also, the configuration of the ESD protection NPN transistor 101 of the semiconductor device 100 is such that the group of contact holes 33 encloses the group of contact holes 32, the group of contact holes 32 encloses the group of contact holes 31, and the group of contact holes 31 encloses the group of contact holes 30, as shown in FIG. 1(a).

Also, the ESD protection NPN transistor 101 of the semiconductor device 100 is such that the p-type semiconductor substrate 1 and n-type layer 10 are short circuited by the metal electrode 7. The ESD protection NPN transistor is configured of the n-type layer 3, p-type layer 2, and n-type layer 10. In FIG. 1, an illustration is given of an example wherein each of the contact holes 30, 31, 32, and 33 is a through hole of a quadrilateral shape, but the shape of the contact holes 30, 31, 32, and 33 is not limited to a quadrilateral shape. Each of the contact holes 30, 31, 32, and 33 may be a through hole of, for example, a circular shape, a striped shape, or a ring shape. A depiction of through holes of a circular shape, a striped shape, or a ring shape is omitted from the drawing.

Next, using FIG. 1, a description will be given of a method of manufacturing the ESD protection NPN transistor 101 of the semiconductor device 100. When manufacturing the ESD protection NPN transistor 101 of the semiconductor device 100, firstly, the n-type layer 10, which has a concentration lower than that of the p-type semiconductor substrate 1, is formed by epitaxial growth on the high concentration p-type semiconductor substrate 1.

Next, the p-type layer 11, which has a concentration higher than that of the n-type layer 10, is formed penetrating the n-type layer 10 and reaching the p-type semiconductor substrate 1. The p-type layer 11 performs a function of making the potential of the p-type semiconductor substrate 1 the potential of the metal electrode 7. Next, the p-type layer 2 is selectively formed in a surface layer of the n-type layer 10, and the LOCOS oxide film 5 is formed on the p-type layer 2, in the vicinity of the p-n junction between the p-type layer 2 and n-type layer 10 and in the vicinity of the p-n junction between the n-type layer 10 and p-type layer 11.

Next, the n-type layer 3 (forming the cathode of a parasitic diode 13 and the collector of an NPN transistor 14), which has a concentration higher than that of the p-type layer 2, is formed by ion implantation and heat treatment in a surface layer of the p-type layer 2 sandwiched by the LOCOS oxide film 5. Also, the p-type layer 4, which has a concentration higher than that of the p-type layer 2, is formed by ion implantation and heat treatment in a surface layer of the p-type layer 2 sandwiched by the LOCOS oxide film 5. Also, the n-type layer 12, which has a concentration higher than that of the n-type layer 10, is formed by ion implantation and heat treatment in a surface layer of the n-type layer 10 sandwiched by the LOCOS oxide film 5. Also, the p-type layer 20, which has a concentration higher than that of the p-type layer 11, is formed in a surface layer of the p-type layer 11. The p-type layers 4 and 20 and the n-type layer 12 are contact layers for reducing contact resistance.

Next, the insulating film 6 is formed on the n-type layer 3 and LOCOS oxide film 5, and the plurality of contact holes 30 are formed in the insulating film 6 on the n-type layer 3. The insulating film 6 is a BPSG film (a borophosphosilicate glass film) or an HTO film (a high temperature oxidation film).

Next, the pad electrode 8 (with an area of, for example, 80 μm×80 μm) is formed on the n-type layer 3, joined with the n-type layer 3 via the plurality of contact holes 30, and the metal electrode 7 is formed, joined with the p-type layer 4, n-type layer 12, and p-type layer 11 via the pluralities of contact holes 31, 32, and 33 respectively. Subsequently, the passivation film 9 is formed on the surface, opened above the pad electrode 8, thus completing the ESD protection NPN transistor 101.

Figure 2:
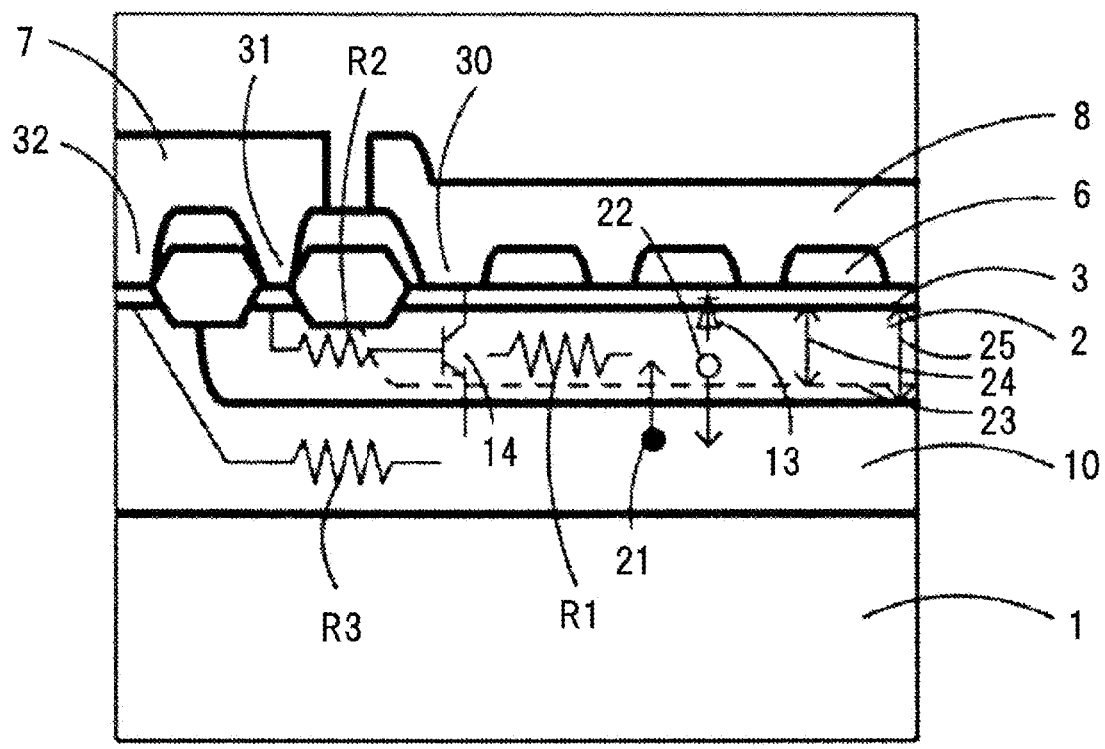
Figure 2:
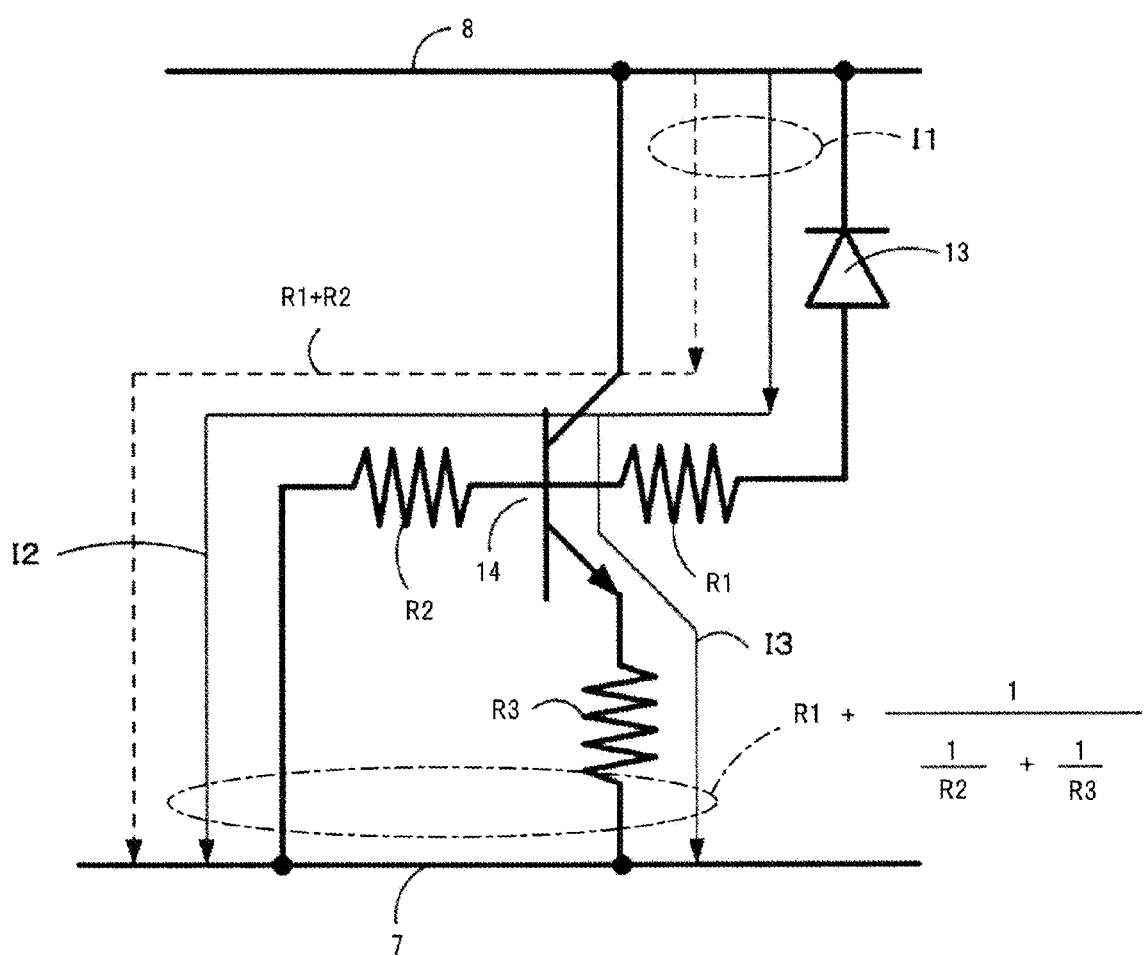

FIG. 2(a) and FIG. 2(b) are diagrams illustrating an operation of the ESD protection transistor 101 of FIG. 1, wherein FIG. 2(a) is an enlarged sectional view of an A portion of FIG. 1(b), and FIG. 2(b) is an equivalent circuit diagram. In FIG. 2, the ESD protection transistor 101 is configured of the NPN transistor 14. The collector of the NPN transistor 14 is connected to the pad electrode 8 (the collector electrode), and the emitter is connected via a lateral resistor R3 of the n-type layer 10 to the metal electrode 7 (the emitter electrode).

The base is connected via lateral resistors R1 and R2 of the p-type layer 2 to the anode of the parasitic diode 13, and the cathode of the parasitic diode 13 is connected to the pad electrode 8. The emitter is connected via the lateral resistor R3 of the n-type layer 10 to the metal electrode 7. The parasitic diode 13 is configured of the base (the p-type layer 2) and collector (n-type layer 3) of the NPN transistor 14.

R2 is of a fixed resistance, while R1 and R3 are of a distributed constant type resistance. Herein, however, for the sake of convenience, R1 and R3, which are of a distributed constant type resistance, are shown converted to a fixed resistance. The NPN transistor 14 operates, and after electrons 21 are injected from the n-type layer 10, which is the emitter, to the p-type layer 2, which is the base, the lateral resistors R1, R2, and R3 are of a low resistance value in a conductivity-modulated state.

Figure 3:
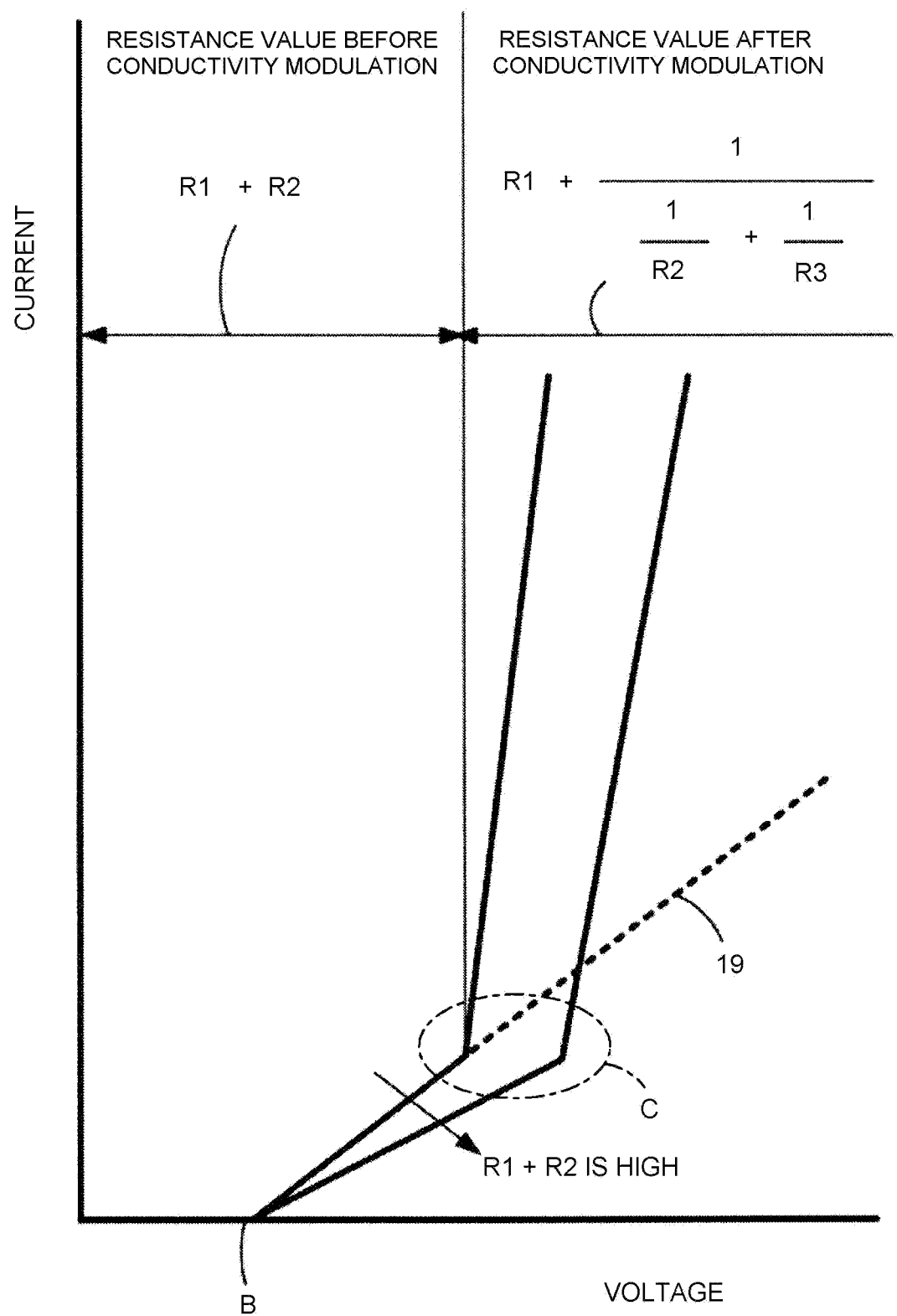
FIG. 3 is a diagram showing the relationship between the voltage and current of the ESD protection NPN transistor 101.

FIG. 3 is a diagram showing the relationship between the voltage and current of the ESD protection NPN transistor 101. The relationship between the collector-emitter voltage and collector current of the NPN transistor 14 is shown in FIG. 3.

In FIG. 3, taking the pad electrode 8 to be positive, voltage is applied to the NPN transistor 14 so that the metal electrode 7 is of ground potential. A current I1 does not flow until the applied voltage becomes an avalanche voltage (point B) of the parasitic diode 13 (the collector-base junction of the NPN transistor 14). At the avalanche voltage, a width 24 of a depletion layer 23 spreading in the p-type layer 2 is less than a width 25 of the p-type layer, and the depletion layer 23 does not reach the n-type layer 10.

When the voltage applied to the parasitic diode 13 exceeds the avalanche voltage (point B), the current I1 indicated by the dotted line flows through the lateral resistors R1 and R2. At this time, the currents flowing through the R1 and R2 are equal. Also, R1 and R2 at this time are of a resistance value before conductivity modulation.

When the potential generated in the lateral resistor R2 by the current I1 becomes in the region of 0.7V higher than the potential of the n-type layer 10, a voltage of in the region of 0.7V is applied to the base-emitter junction of the NPN transistor, and a current I3 starts to flow through the n-type layer 10, too. At this time, the current I1 flowing along the path indicated by the dotted line in FIG. 2 changes to the current I1 flowing along the path indicated by the solid line in FIG. 2. The current I1 indicated by the solid line becomes a current I2 flowing through the lateral resistor R2 of the p-type layer 2 and the current I3 flowing through the base-emitter junction. The current I3 flows into the metal electrode 7 via the lateral resistor R3 of the n-type layer 10.

By the base-emitter junction of the NPN transistor 14 being forward-biased, the electrons 21 are injected from the emitter into the base, holes 22 are injected from the base into the emitter, and the NPN transistor becomes conductive. Because of the injections, conductivity modulation occurs in the p-type layer 2 and n-type layer 10, and the resistance values of the lateral resistors R1, R2, and R3 decrease considerably. As a result of this, the operating resistance of the ESD protection transistor 101 decreases considerably. Because of this, the current-voltage curve shown in FIG. 3 bends at a point C in FIG. 3, a large current flows through the NPN transistor, and the increase in voltage decreases.

As previously described, the current path becomes the path indicated by the solid line in FIG. 2(b) after the NPN transistor 14 operates, and the current I1 becomes the current I2+the current I3. The gradient of the current-voltage curve increases sharply, as shown in FIG. 3, when the current I1 becomes the current I2+the current I3.

As shown in FIG. 3, the operating resistance after the NPN transistor operates is R1+(1/((1/R2)+(1/R3))). As R1, R2, and R3 at this time are of the resistance values after conductivity modulation, they are considerably lower than the resistance values obtained from a diffusion profile. Because of this, the operating resistance after the NPN transistor 14 operates is considerably lower than the operating resistance before the operation.

Meanwhile, the operating resistance before avalanche occurs in the diode and the transistor operates is R1+R2. As this R1+R2 is the resistance obtained from a diffusion profile before conductivity modulation, it is of a high value. That is, the resistance values of R1 and R2 are high before the transistor operates, and become low values after the operation. The dotted line indicated by reference sign 19 in FIG. 3 is in the case of a parasitic diode only, and corresponds to the case of an ESD protection diode.

In this way, it is possible to considerably reduce the operating resistance by using a transistor as the ESD protection element. As a result of this, it is possible to improve a function of protecting the device against surge voltage, and possible to considerably reduce the area of the pad electrode 8 (for example, a reduction of from several tens of times to several hundred times). Because of this, it is possible to reduce the area occupied by the ESD protection transistor 101 compared with that of an ESD protection diode, and thus possible to reduce the chip size. Also, it is possible for the ESD protection transistor 101 to be a highly reliable semiconductor device with ESD tolerance superior to that of an ESD protection diode.

Also, as the insulating film 6 is spread under the pad electrode 8, it is possible, in comparison with when no insulating film 6 is spread, to reduce the stress exerted on the silicon layers (the n-type layer 3, p-type layer 2, and the like) when wire bonding or when probing in order to evaluate characteristics.

Figure 7:
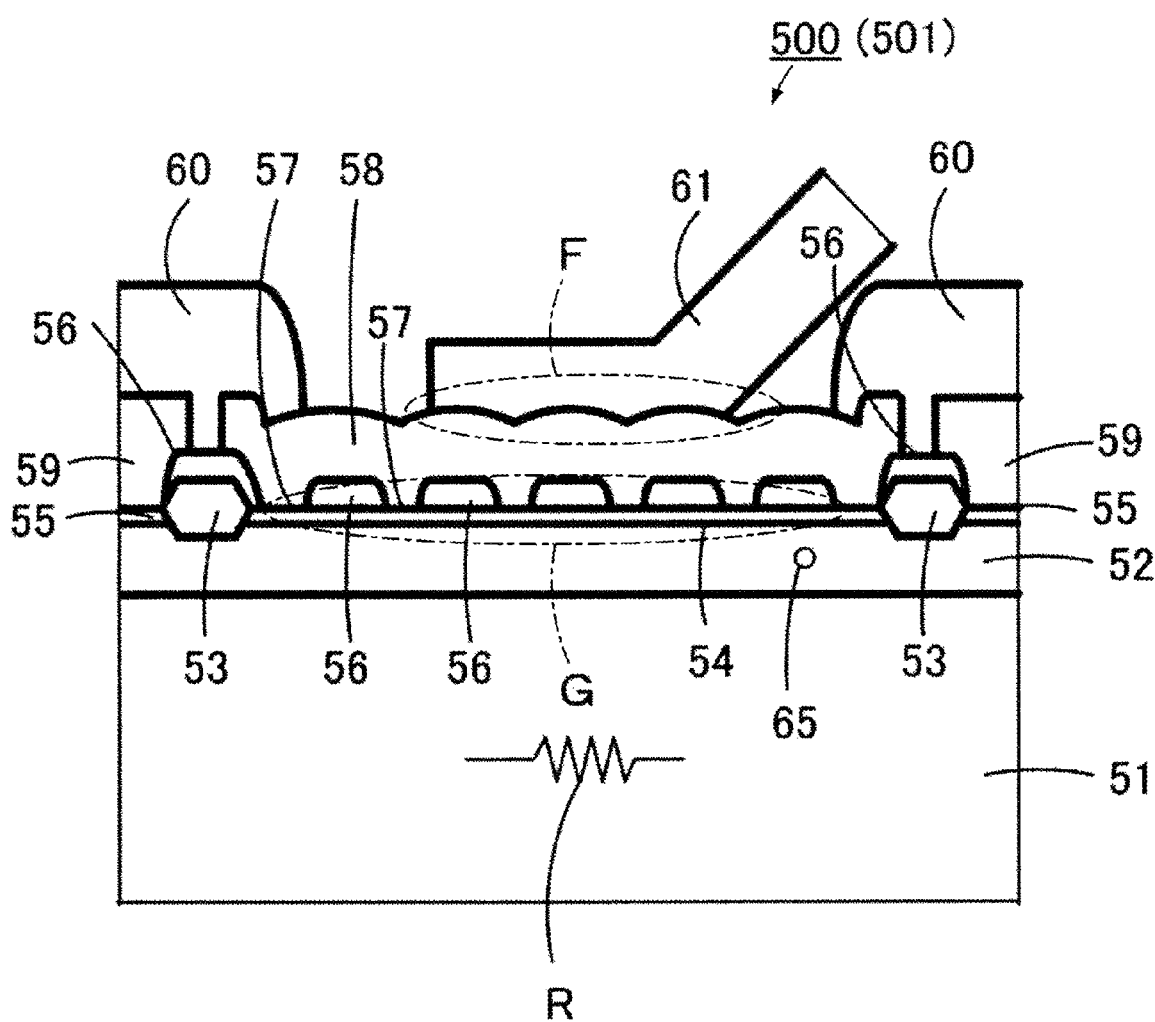
FIG. 7 is a main portion sectional view of a semiconductor device having a heretofore known ESD protection diode.
Figure 8:
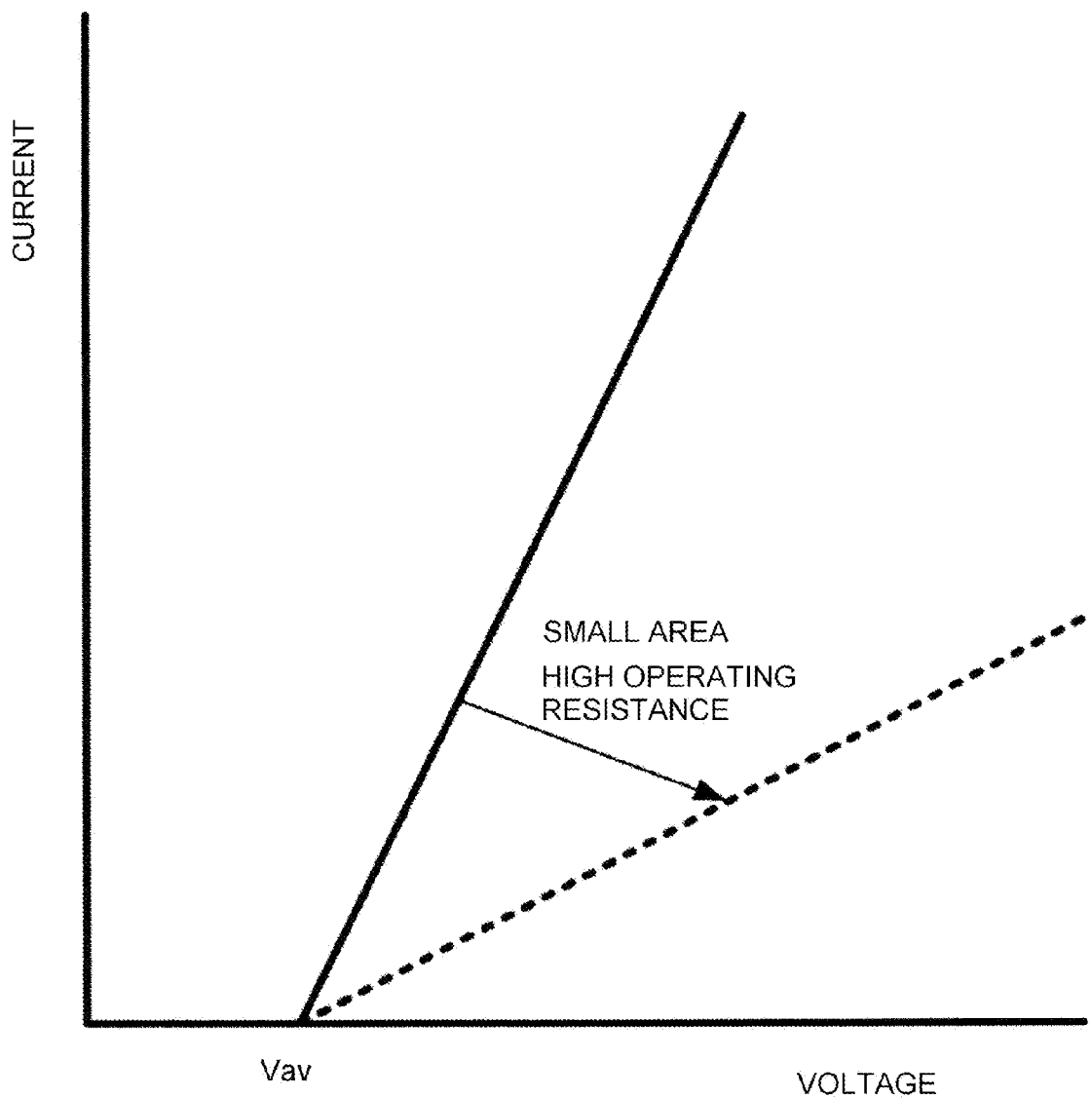
FIG. 8 is a diagram showing the relationship between the voltage and current of the heretofore known ESD protection diode 501.

In FIG. 1, the surface of the pad electrode 8 is shown as being flat and smooth for the sake of convenience, but it is actually uneven, as shown in FIG. 7. Also, it is preferable that the current I2 flowing through R1 and R2 and the current I3 flowing through R3 flow in a plane and evenly owing to the contact holes 31 and 32 being disposed so as to enclose the pad electrode 8.

Embodiment 2

Next, a description will be given of a configuration of a semiconductor device of Embodiment 2 according to the invention. In Embodiment 2, portions the same as in Embodiment 1 are indicated by the same reference numbers, and a description thereof is omitted. FIG. 4(a) and FIG. 4(b) are configuration diagrams of the semiconductor device of Embodiment 2 according to the invention, wherein FIG. 4(a) is a main portion plan view, and FIG. 4(b) is a main portion sectional view cut along an X-X line of FIG. 4(a).

The ESD protection NPN transistor 101 of the semiconductor device 100 shown in FIG. 1 is such that, as the contact holes 30 are formed in the insulating film 6, the surface of the pad electrode 8 on the insulating film 6 is somewhat uneven, because of which, it is supposed that a problem will occur in that the junction strength of the bonding wire and pad electrode 8 decreases. Also, it is supposed that a problem will occur in that the silicon layers may be damaged by stress when bonding or probing. The semiconductor device of Embodiment 2 according to the invention is such that it is possible to alleviate these kinds of problem.

An ESD protection NPN transistor 201 of the semiconductor device 200 of Embodiment 2 according to the invention differs from the ESD protection NPN transistor 101 of the semiconductor device 100 shown in FIG. 1 in that an upper layer pad electrode 16 is formed on the pad electrode 8, electrically connected to the pad electrode 8 via contact holes 34 formed in an interlayer insulating film 15.

As the central portion of the upper layer pad electrode 16 is the place where wire bonding is carried out, the contact holes 34 formed in the interlayer insulating film 15, which connects the pad electrode 8 and upper layer pad electrode 16, are provided above a peripheral portion of the pad electrode 8.

Next, using FIG. 4, a description will be given of a method of manufacturing the ESD protection NPN transistor 201 of the semiconductor device 200 of Embodiment 2 according to the invention. When manufacturing the ESD protection NPN transistor 201 of the semiconductor device 200 of Embodiment according to the invention, there is a shift to a manufacturing method peculiar to the ESD protection NPN transistor 201 of the semiconductor device 200 shown in FIG. 4 after the step of forming the pad electrode 8 and metal electrode 7 of the method of manufacturing the ESD protection NPN transistor 101 of the semiconductor device 100 shown in FIG. 1.

When manufacturing the ESD protection NPN transistor 201 of the semiconductor device 200 of Embodiment 2 according to the invention, the interlayer insulating film 15 is formed on the pad electrode 8 after the step of forming the pad electrode 8 and metal electrode 7, and the contact holes 34 (upper layer contact holes) are formed in the periphery of the interlayer insulating film 15. Specifically, the contact holes 34 such that aperture portions are opened to dimensions of, for example, 1.2 μm×1.2 μm are formed. The contact holes 34 are formed in the interlayer insulating film 15 above an outer peripheral portion of the pad electrode 8. The interlayer insulating film 15 is a BPSG film (a borophosphosilicate glass film) or an HTO film (a high temperature oxidation film).

Next, the upper layer pad electrode 16 connected to the pad electrode 8 via the contact holes 34 is formed on the pad electrode 8. Subsequently, the passivation film 9 is formed on the surface, opened above the upper layer pad electrode 16, thus completing the ESD protection NPN transistor 201.

The ESD protection transistor 101 of the semiconductor device 100 of FIG. 1 is such that, as previously described, the surface of the pad electrode 8 is uneven, reflecting the unevenness of the underlying insulating film 6. Because of this, the junction strength of the bonding wire fixed to the pad electrode 8 is liable to decrease, and the underlying silicon layers are liable to be damaged.

Figure 4:
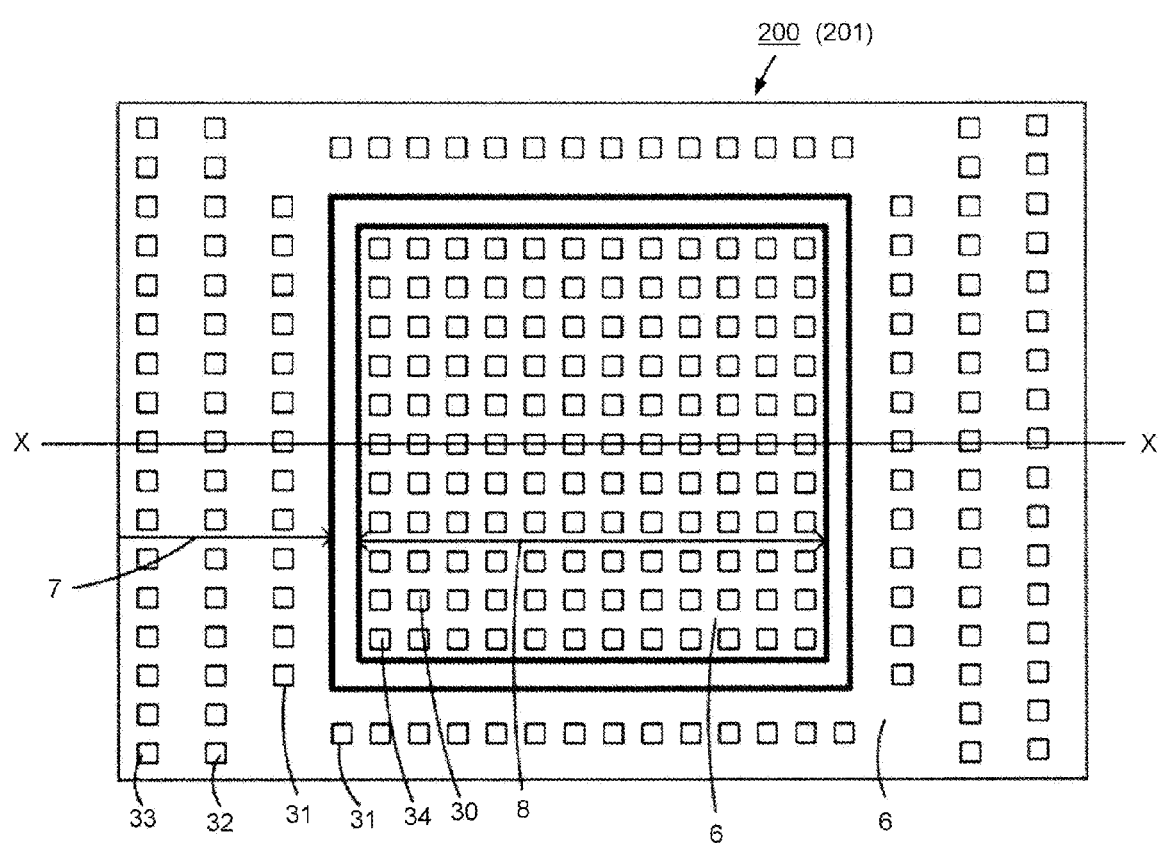
Figure 4:
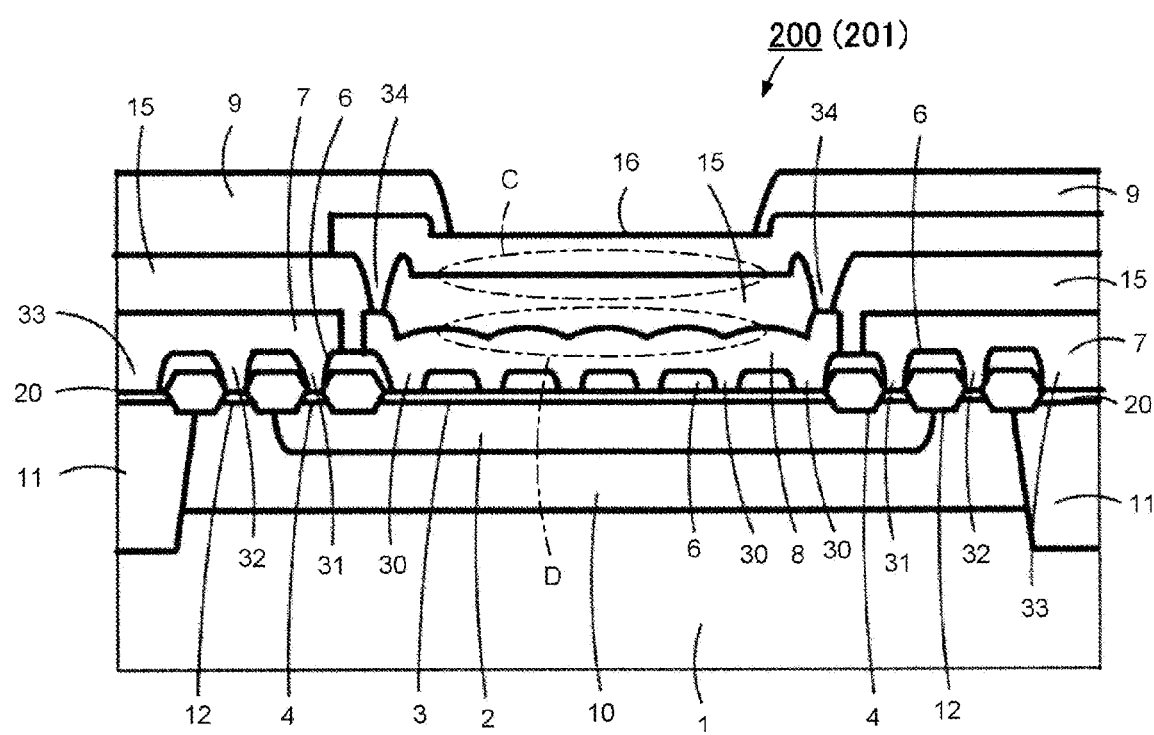

Meanwhile, the ESD protection NPN transistor 201 of the semiconductor device 200 shown in FIG. 4 is such that, although the surface of the pad electrode 8 is somewhat uneven, as in a place (portion D) indicated by reference sign D in FIG. 4, it is possible for the surface of the upper layer pad electrode 16 to be flattened and smoothed, as shown in a portion C, by covering the pad electrode 8 with the interlayer insulating film 15, and forming the upper layer pad electrode 16 on the interlayer insulating film 15. By fixing the bonding wire to the flattened and smoothed upper layer pad electrode 16, it is possible to increase the junction strength of the bonding wire. Also, the underlying silicon layers are unlikely to be damaged when bonding.

The function of the ESD protection NPN transistor 201 of the semiconductor device 200 shown in FIG. 2 that protects the device against surge voltage is the same as that of the ESD protection NPN transistor 101 of the semiconductor device 100 shown in FIG. 1. It is preferable that the current I3 flowing through R3 flows in a plane and evenly owing to the contact holes 32 being disposed so as to enclose the pad electrode 8.

Embodiment 3

Next, a description will be given of a configuration of a semiconductor device of Embodiment 3 according to the invention. In Embodiment 3, portions the same as in Embodiment 1 and Embodiment 2 are indicated by the same reference numbers, and a description thereof is omitted. FIG. 5(a) and FIG. 5(b) are configuration diagrams of the semiconductor device of Embodiment 3 according to the invention, wherein FIG. 5(a) is a main portion plan view, and FIG. 5(b) is a main portion sectional view cut along an X-X line of FIG. 5(a).

Figure 5:
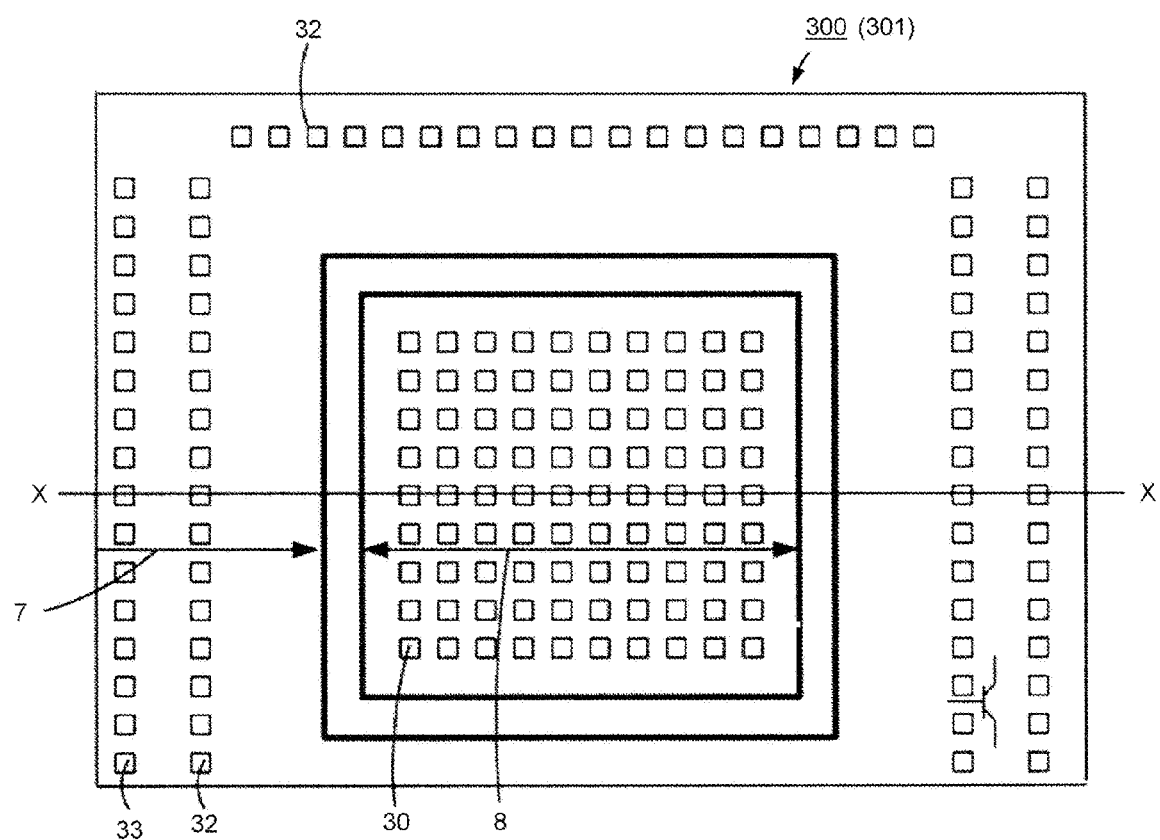
Figure 5:
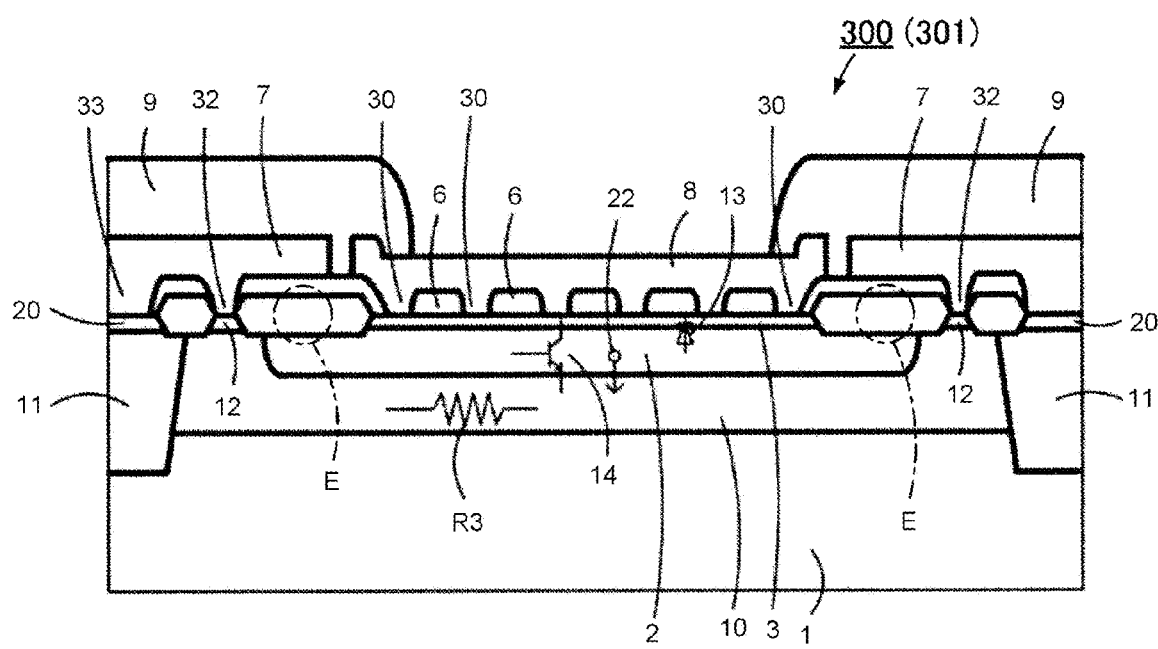

An ESD protection NPN transistor 301 of the semiconductor device 300 of Embodiment 3 according to the invention differs from the ESD protection NPN transistor 201 of the semiconductor device 200 of Embodiment 2 according to the invention shown in FIG. 4 in that no contact holes 31 are formed in a place (portion E) indicated by reference sign E in FIG. 5, so that the p-type layer 2 is not brought into contact with the metal electrode 7. That is, the difference is that the NPN transistor 14 of the heretofore described embodiment is an open-base NPN transistor.

Figure 6:
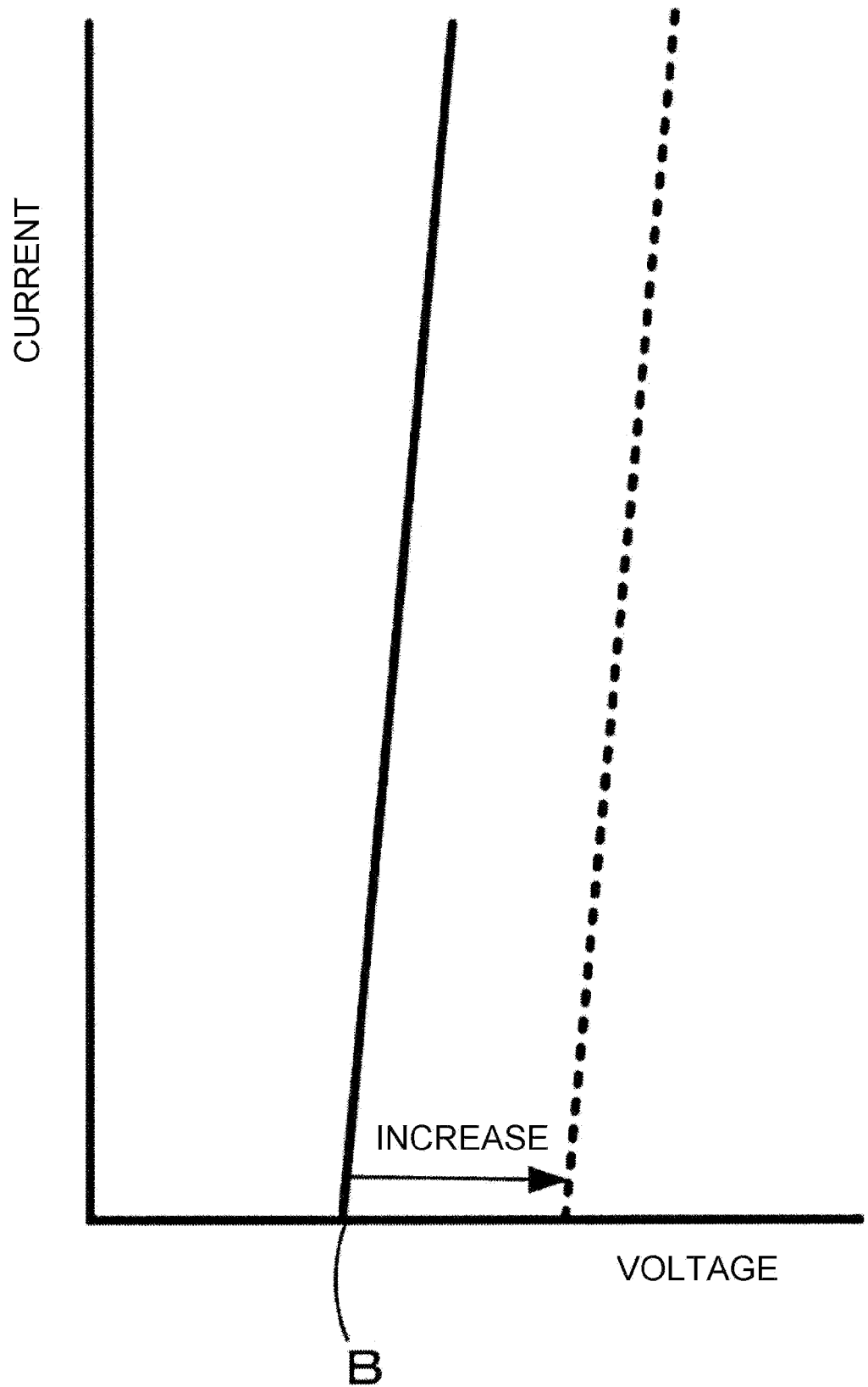
FIG. 6 is a diagram showing the relationship between the voltage and current of an ESD protection NPN transistor 301.

FIG. 6 is a diagram showing the relationship between the voltage and current of the ESD protection NPN transistor 301. The relationship between the collector-emitter voltage and collector current of the NPN transistor 14 is shown in FIG. 6. The ESD protection NPN transistor 301 is such that, as the p-type layer 2 is not connected to the metal electrode 7, the base of the NPN transistor 14 is open. Because of this, the NPN transistor 14 starts to operate at the point (point B of FIG. 6) at which avalanche occurs in the parasitic diode 13, the current increases sharply, and the surge voltage is clamped.

In this case, the holes 22 generated by the avalanche (breakdown) in the parasitic diode 13 are accumulated in the p-type layer 2 rather than flowing from the p-type layer 2 to the metal electrode 7. Because of this, the base-emitter voltage of the NPN transistor 14 instantly reaches 0.7V at the point at which avalanche occurs in the parasitic diode 13, and the NPN transistor 14 starts to operate (becomes conductive). Also, conductivity modulation occurs in the n-type layer 10 owing to the holes 22 injected from the p-type layer 2 into the n-type layer 10, and the n-type layer 10 lateral resistor R3 resistance value becomes low. Because of this, the operating resistance of the ESD protection NPN transistor 301 decreases.

Also, as the base is open, the threshold voltage (avalanche voltage) at point B decreases. The amount of the decrease in the threshold voltage (avalanche voltage) at point B due to the base being open can be recovered by a diode being formed of polysilicon on the n-type layer 3 under the pad electrode 8, and the diode being connected in series to the NPN transistor 14 (omitted from the drawing). Because of this, it is possible to increase the threshold voltage (the voltage at point B), as shown by the dotted line in FIG. 6.

It is also possible to increase the threshold voltage by reducing the impurity concentration of the p-type layer 2 and increasing the depth of the p-type layer 2. In this case, too, it is possible to obtain the same advantages as with the semiconductor device of Embodiment 2 according to the invention by forming the interlayer insulating film 15 on the pad electrode 8, and forming the upper layer pad electrode 16 on the interlayer insulating film 15, as in the semiconductor device of Embodiment 2 according to the invention.

INDUSTRIAL APPLICABILITY

As heretofore described, the semiconductor device according to the invention is useful as a semiconductor device having an ESD protection element, and in particular, is suitable as a semiconductor device wherein it is possible to reduce the area and operating resistance of the ESD protection element, and achieve an increase in ESD tolerance.

REFERENCE SIGNS LIST 1 p-type semiconductor substrate
2, 4, 11, 20 p-type layer
3, 10, 12 n-type layer
5 LOCOS oxide film
6 Insulating film
7 Metal electrode
8 Pad electrode
9 Passivation film
13 Parasitic diode
14 NPN transistor
15 Interlayer insulating film
16 Upper layer pad electrode
19 Dotted line
21 Electron
22 Hole
23 Depletion layer
24 Depletion layer width
25 p-type layer width
30, 31, 32, 33, 34 Contact hole
100, 200, 300 Semiconductor device
101, 201, 301 ESD protection NPN transistor
R1, R2, R3 Lateral resistor
I1, I2, I3 Current

The invention claimed is:
1. A semiconductor device, comprising:
a first conductivity type first semiconductor layer;
a second conductivity type emitter semiconductor layer disposed on the first semiconductor layer;
a first conductivity type base semiconductor layer selectively disposed on the emitter semiconductor layer;
a second conductivity type collector semiconductor layer selectively disposed on the base semiconductor layer;
a insulating film disposed on the collector semiconductor layer;
a pad electrode disposed on the insulating film, electrically connected via a plurality of contact holes formed in the insulating film to the collector semiconductor layer; and
a metal electrode electrically connected to the first semiconductor layer, emitter semiconductor layer, and base semiconductor layer, wherein
the width of the base semiconductor layer sandwiched between the emitter semiconductor layer and collector semiconductor layer is greater than the width of a depletion layer spreading toward the first semiconductor layer in the base semiconductor layer at the avalanche voltage of a diode formed of the collector semiconductor layer and base semiconductor layer, and a transistor formed of the collector semiconductor layer, base semiconductor layer, and emitter semiconductor layer becomes conductive at a voltage higher than the avalanche voltage of the diode.

2. A semiconductor device, comprising:
   a first conductivity type first semiconductor layer;
   a second conductivity type emitter semiconductor layer disposed on the first semiconductor layer;
   a first conductivity type base semiconductor layer selectively disposed on the emitter semiconductor layer;
   a second conductivity type collector semiconductor layer selectively disposed on the base semiconductor layer;
   a insulating film disposed on the collector semiconductor layer;
   a pad electrode disposed on the insulating film and electrically connected via a plurality of contact holes formed in the insulating film to the collector semiconductor layer; and
   a metal electrode electrically connected to the first semiconductor layer and base semiconductor layer, wherein
   a transistor formed of the collector semiconductor layer, base semiconductor layer, and emitter semiconductor layer becomes conductive by carriers generated by avalanche in a diode formed of the collector semiconductor layer and base semiconductor layer accumulating in the base semiconductor layer.

3. The semiconductor device according to claim 1, wherein the metal electrode is electrically connected to the base semiconductor layer via a plurality of contact holes formed in a insulating film disposed on the base semiconductor layer, and the plurality of contact holes are disposed so as to enclose the periphery of the pad electrode.

4. The semiconductor device according to claim 1, further comprising:
   an interlayer insulating film disposed on the pad electrode;
   a plurality of upper layer contact holes disposed in the interlayer insulating film above an outer peripheral portion of the pad electrode; and
   an upper layer pad electrode disposed on the interlayer insulating film and electrically connected via the upper layer contact holes.

5. The semiconductor device according to claim 1, wherein the insulating film and interlayer insulating film are BPSG films or HTO films.

6. The semiconductor device according to claim 2, wherein the metal electrode is electrically connected to the base semiconductor layer via a plurality of contact holes formed in a insulating film disposed on the base semiconductor layer, and the plurality of contact holes are disposed so as to enclose the periphery of the pad electrode.

7. The semiconductor device according to claim 2, further comprising:
   an interlayer insulating film disposed on the pad electrode;
   a plurality of upper layer contact holes disposed in the interlayer insulating film above an outer peripheral portion of the pad electrode; and
   an upper layer pad electrode disposed on the interlayer insulating film and electrically connected via the upper layer contact holes.

8. The semiconductor device according to claim 3, further comprising:
   an interlayer insulating film disposed on the pad electrode;
   a plurality of upper layer contact holes disposed in the interlayer insulating film above an outer peripheral portion of the pad electrode; and
   an upper layer pad electrode disposed on the interlayer insulating film and electrically connected via the upper layer contact holes.

9. The semiconductor device according to claim 2, wherein the insulating film and interlayer insulating film are BPSG films or HTO films.

10. The semiconductor device according to claim 3, wherein the insulating film and interlayer insulating film are BPSG films or HTO films.

11. The semiconductor device according to claim 4, wherein the insulating film and interlayer insulating film are BPSG films or HTO films.

* * * * *